March 10, 1970 S. C. BROWN 3,500,316

VARIABLE GAIN AMPLIFIER

Filed Aug. 22, 1967

2 Sheets-Sheet 1

STEWART C. BROWN,
INVENTOR.
BY.

GOLOVE & KLEINBERG,
ATTORNEYS.

VARIABLE GAIN AMPLIFIER

Filed Aug. 22, 1967 2 Sheets-Sheet 2

United States Patent Office 3,500,316
Patented Mar. 10, 1970

3,500,316
VARIABLE GAIN AMPLIFIER

Stewart C. Brown, Los Angeles, Calif., assignor, by mesne assignments, to Digital Data Systems, Inc., Houston, Tex., a corporation Filed Aug. 22, 1967, Ser. No. 662,513
Int. Cl. H03f 1/36
U.S. Cl. 330—86 5 Claims

ABSTRACT OF THE DISCLOSURE

A variable gain amplifier is described which includes a gain regulating, feedback loop that selectively includes or excludes increments of feedback impedance for changing the overall gain of the amplifier in steps according to a pre-selected scaling system.

This invention relates to variable gain amplifiers and more particularly to an incremental gain amplifier which selectably varies its gain by predetermined amounts.

A preferred embodiment of the present amplifier has been disclosed in the co-pending application of Kenji Watanabe and Ralph D. Hasenbalg, Ser. No. 657,454, filed June 16, 1967, which has been assigned to the assignee of the present invention. Portions of that specification and drawings of that application have been incorporated herein.

In typical, prior art digital seismic recording systems, such as have been disclosed in the prior patents to, for example, R. J. Loofbourrow, No. 3,241,100, issued Mar. 15, 1966, or the British patent to Jersey Production Research Company, No. 978,171, published Dec. 16, 1964, various schemes to achieve incremental gain changes in an amplifier are disclosed. Still other digitally controlled amplifiers have been described, for example, in the papers presented to a meeting of the Society of Exploration Geophysicists in November of 1965.

One such system, for example, is described in Paper G–12 of that meeting by Paul Sherer and Lorenz Shock, which includes an automatic gain ranging amplifier. Each "channel" includes a pair of alternately energizable, variable gain amplifiers, each with two gain settings that are alternatively selected. The output of the selected amplifier is applied to a multiplexer. A time shared, analog-to-digital converter, is provided with a third amplifier, at the input, that is settable to one of four gain levels. Obviously, any noise introduced in the multiplexer is amplified before the analog-to-digital conversion step and is therefore digitized.

In the Loofbourrow patent, there is taught a plurality of amplifiers in series, each with fixed gain. Maximum gain is achieved if all amplifiers are connected. It is possible to select an output from any one of the amplifiers, for lesser amounts of gain. With a plurality of amplifiers, noise in the earlier stages is amplified, together with the analog information signal.

Yet other systems have been devised which, prior to the analog-to-digital conversion step, amplified the analog signal using an amplifier system whose gain is variable in discrete, incremental steps. Incremental changes of gain may have binary significance, decimal significance or, in other embodiments, and depending upon the apparatus employed, significance in systems of yet other numerical bases.

During the acquisition and recordation of information, it is important not only that the magnitude of the amplified signal be accurately represented in digital terms, but that the magnitude of the gain employed also be recorded as a "scaling factor," which affects the actual magnitude of the digital signal. This information, suitably recorded, is necessary to provide an accurate representation of the data recorded.

The improved digital gain amplifier of the present invention is capable of a gain range of $2^{12}$ in discrete, binary steps for a maximum gain of 4096 to 1. A 4-bit binary counter is used, both to control the gain of the amplifier and to provide to the recording device, information as to the gain setting of the amplifier at any time.

In a preferred embodiment of the present invention, useful in a seismic data acquisition system, such as was disclosed in the co-pending Watanabe et al. application, a pair of variable gain amplifiers according to the present invention are serially connected. The first amplifier of the pair has three gain settings, corresponding to amplifying factors or gains of 1, 16, and 256, which may also be represented as $2^0$, $2^4$ and $2^8$. The second amplifier of the pair may have as many as five gain settings, respectively corresponding to gains of 1, 2, 4, 8 and 16 or $2^0$, $2^1$, $2^2$, $2^3$, and $2^4$. By selecting a gain value for each of the amplifiers, the combination can provide, in binary steps, an overall total gain of from 1 through 4,096 or $2^0$–$2^{12}$. If the settling time requirements for the amplifier system are stringent, the fifth gain setting in the second amplifier is not used.

In alternative embodiments, the steps of gain may represent changes in the scaling factor of any other number base system. For example, a selectable gain amplifier may provide gain setting of 1, 10 and 100, or $10^0$, $10^1$, and $10^2$, using a decimal number system. Still other gain steps are possible.

The variable gain feature is achieved by providing an operational amplifier with a variable impedance feedback loop which, in the preferred embodiment, is a resistive impedance. By a novel combination of switching elements, the output of the amplifier at all times is selectively applied to one of a plurality of serially connected resistors. For unity gain, only a predetermined resistance is provided. For greater gain, resistive impedance is incrementally increased by a factor of 2. With precision resistors, better than .1% accuracy is achievable from the combination.

The output of the amplifier is "taken" from the point of connection into the feedback loop and, as the point of application of signal to the feedback loop is "moved," the amplifier output is also "moved," as though a potentiometer with a sliding tap were used as an input to the feedback loop. Through electronic switching, a tapped potentiometer is realized without the use of moving parts.

In an alternative embodiment, a plurality of impedance elements are arranged in parallel with impedance magnitudes having a predetermined relationship each with the other. Through appropriate switching circuits, the output of amplifier is selectively applied to only one of the impedance elements. Through appropriate gating circuits, the amplifier circuit output is taken from the point of application of the signal to the feedback loop. The alternative embodiment is to be considered a parallel version of the preferred, series connected, variable gain amplifier.

The novel features which are believed to be characteristic of the invention, both as to organization and method of operation, together with further objects and advantages thereof will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

Figure 1:
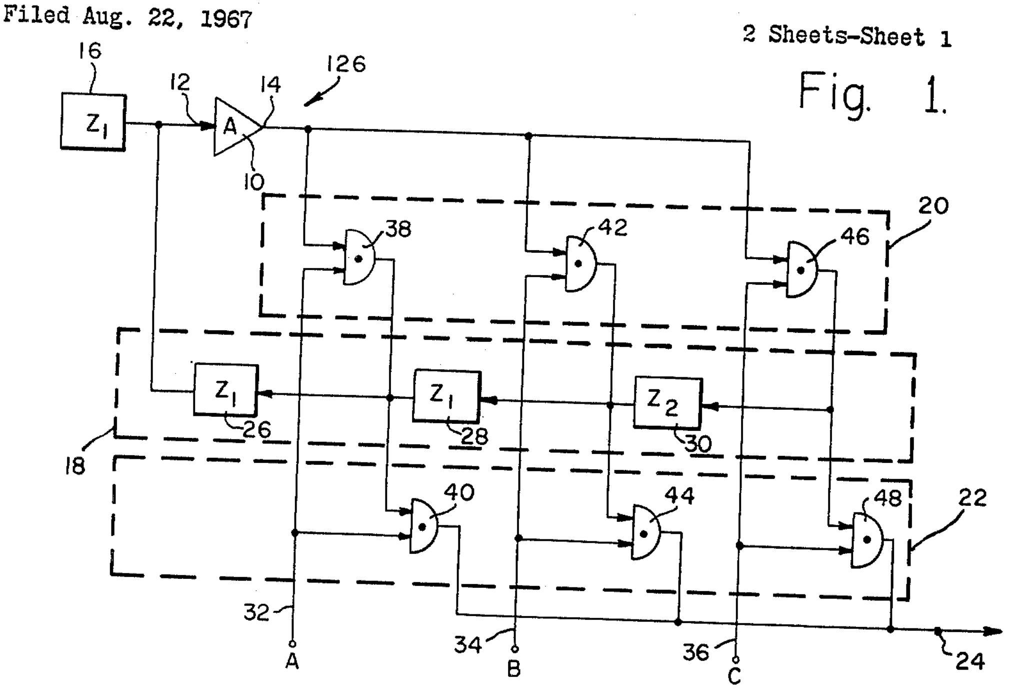
FIG. 1 is a block diagram of a variable gain amplifier according to the present invention.

Turning first to FIG. 1, there is shown in general block diagram, a variable gain amplifier system 126. This system includes an amplifier 10 having an input terminal 12 and an output terminal 14. An input impedance element 16 of predetermined impedance $Z_1$ is connected to the input terminal 12 as is the output of a feedback loop 18.

A plurality of feedback control gates are included in a feedback control block 20 and are commonly connected to the output terminal 14 of the amplifier 10 and a corresponding plurality of output gates 22 are included in an output gate block and are commonly connected to an overall system output terminal 24.

For the purposes of the present example, only three impedance elements 26, 28, 30 have been shown serially interconnected in the feedback impedance loop 18. A first impedance element 26 has an impedance magnitude $Z_1$, a second element 28 has a magnitude of $Z_1$, and a third element 30 has an impedance magnitude of $Z_2$.

Providing an input impedance 16 having a magnitude $Z_1$ and a feedback element 26 having an equal impedance of $Z_1$ (if only the first feedback impedance element 26 is selected for inclusion in the feedback loop), the overall system gain would be equal to 1. Since as shown, the second feedback element 28 also has an impedance magnitude of $Z_1$, selecting an input through the serially connected first and second impedance elements 26, 28, would provide an overall system gain of 2.

In order to provide a third gain setting, equal to 4, the third impedance element 30 is serially connected to the first and second elements 26, 28. The impedance magnitude of the third element 30, is $Z_2$, which is made equal to $2 \cdot Z_1$. The total feedback impedance is then $4 \cdot Z_1$, where $Z_1$ equals the input impedance.

A plurality of gain control signal lines are provided including an "A" gain control line 32, a "B" gain control line 34 and a "C" gain control line 36. The "A" line 32 when energized, in this example, provides an overall system gain of 1, and similarly, the energization of the "B" line 34 provides a gain of 2, and the "C" line 36 provides a gain of 4.

The feedback control block 20 and output gate block 22, each include three gates, respectively connected to the A, B, and C lines 32, 34, 36. Each gain control signal line energizes both a feedback control gate and an output gate. While the gates of FIG. 1 have been indicated using the conventional signals for digital "AND" gates, it will be understood that these gates are analog gates that are capable of transmitting the amplifier 10 output without change or modificaion. Both the feedback control block 20 and the output block 22 are necessary to prevent sneak paths through the generally symmetrical impedance elements of the feedback impedance loop 18.

In operation, energization of the "A" gain control line 32 would enable a first feedback control gate 38 and a first output gate 40, thus completing a signal path from amplifier 10 output terminal 14, through the first feedback gate 38 control to the first impedance element 26 and the first output gate 40. The output of the first output gate 40 is connected to the system output terminal 24.

If a different gain setting is desired, then another of the gain control signal lines, for example the B control line 34 is energized which, in turn, enables a second feedback control gate 42 and a second output gate 44. The amplifier 10 output is then applied through the serially connected first and second impedance elements 26 and 28, and the circuit output is applied through the second output gate 44 to the output terminal 24.

As shown, the third gain setting is achieved by energizing the "C" gain control line 26, which, in turn, enables a third feedback control gate 46 and a third output gate 48. This applies the output of the amplifier 10 to the third impedance element 30, which is serially connected to the first two impedance elements 26, 28 thereby including all of the impedance feedback loop for maximum gain of the illustrated circuits.

Figure 2:
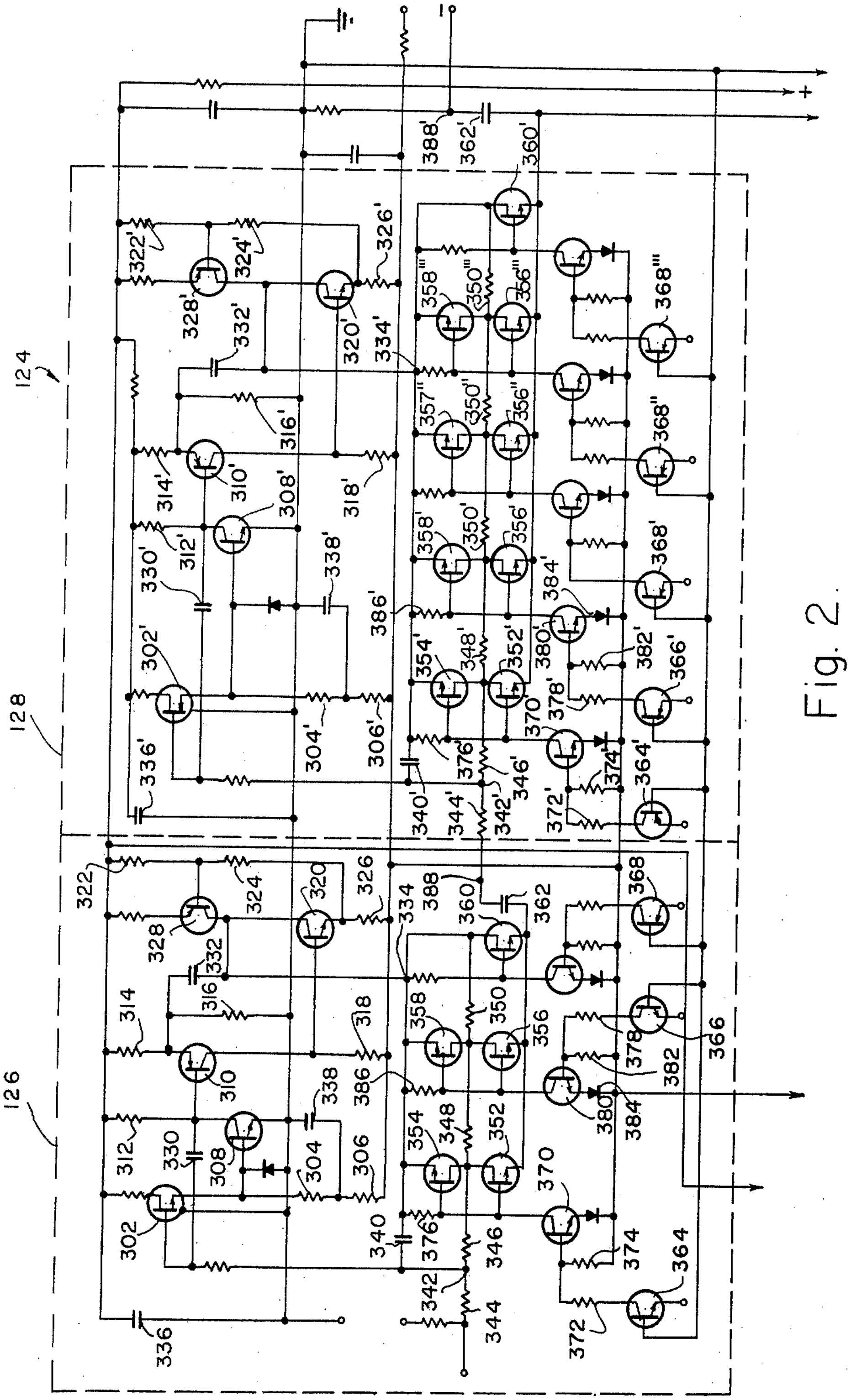
FIG. 2 is a circuit diagram of a preferred embodiment of a binary gain amplifier.

With reference to FIG. 2, which is a circuit diagram of a preferred embodiment of a variable gain amplifier 124, as described and shown in the copending Watanabe et al. application, it will be noted that the amplifier 124 is comprised of subcircuits, which are the substantially identical first and second variable gain amplifier sections 126, 128. Because of the similarity of the first and second amplifier sections 126, 128, the description of the first section 126 shall be applicable to both. Similar reference numbers but with primes have been used to distinguish the similar components of the second amplifier section 128. Any differences in the two circuits will be specially noted.

First amplifier section 126 provides alternative gains of 1, 16, or 256, determined by appropriate selecting circuits which interpose appropriate magnitudes of resistive impedance into the gain feedback loop. Gain steps available from the second section 128 include gains of 1, 2, 4, 8, and 16, also controlled by selecting circuits. The main differences in the two circuits are the magnitudes of the impedances of the feedback resistors and the number of stages of gain. The overall gain of the amplifier 124 is the product of the gains of the individual sections.

The amplifier input is applied to an N-channel, silicon, field-effect transistor, FET 302 which should be specially selected for low noise operation. The input stage operates in a source-follower configuration, with a high input impedance. The drain-to-source current is approximately one milliampere, as determined by the values of resistors 304, 306.

The output of the source follower is connected directly to a grounded-emitter transistor 308. The output at the collector of transistor 308 is direct-coupled to the base of a transistor 310. Collector load for transistor 308 is a resistor 312.

Emitter bias for the transistor 310, is provided by the resistive divider combination of resistor 314 and 316. The resistor 318 supplies the collector load. The output of the transistor 310 is coupled to a transistor 320 which utilizes the resistive divider of the resistors 322, 324 and 326 for operating bias. This same resistor network provides a reference voltage for a constant current source transistor 328. A capacitor 330 provides a minor loop feedback path from the collector of the transistor 308 to the gate of the FET 302 to provide a stable operating condition.

A capacitor 332 provides a negative feedback from the output terminal 334 of the amplifier to the emitter of the transistor 310. A decoupling filtering action for the input stage to the amplifier is provided by capacitors 336 and 338. A feedback capacitor 340 insures the proper "roll off" rate at the unity gain, crossover frequency.

The variable gain amplifier sections 126, 128, are connected in an operational amplifier configuration, with the summing node at the junction 342 of an input resistor 344 and a feedback resistor 346. For maximum gain of 256 in the first amplifier section 126, the total feedback resistance is equal to the sum of the values of the resistors, 346, 348, and 350. A plurality of FET switches, 352, 354, 356 and 358 are "cut off" during the high gain (256) mode. An output, FET 360, is turned on, thereby connecting the amplifier output to a coupling capacitor 362.

When a gain of 16 is selected, the FET switches 356 and 358 are turned "on" and FET 360 is cut off. The FET switches 352 and 354 remain cut off. The drain-to-source resistance during conduction of a FET switch is approximately 300 ohms. The feedback resistor 348 is connected through the FET 358 switch resistance to the collectors of transistors 320 and 328.

The true output point of the amplifier section 126 becomes the commonly connected drain terminals of the switches 358 and 356. This output is coupled through the conductive resistance of the switch 356 to the coupling capacitor 362. The series resistance of the switch 358, during conduction, adds to the open loop output impedance of the amplifying stages.

In the unity gain operating condition, the FET switches 352 and 354 are turned "on" and the switches 356, 358 and 360 are cut "off." This condition provides a maximum total of feedback resistance. (The impedance of resistor 346 is added to the resistance of the conducting FET switch 354.) The transistors 364, 366 and 368 are operating in a grounded base configuration, and have their emitters connected to outputs of decoding gates (not shown) which are located in the decode logic section 144.

When a gain unity or "1" is selected, the emitters of the transistors 366 and 368 are held at a positive potential, and the emitter of the transistor 364 is grounded through the decoding gates. This causes the transistor 364 to cut "off" thereby cutting off the transistor 370, due to loss of current through the resistors 372 and 374. With transistor 370 cut off, and the gates of the FET switches 352 and 354 coupled to the source of the switch 354 through the resistor 376, the switch 354 conducts and causes the drain of the FET switch 354 to assume the same potential as the source. This, in turn, places the drain of the FET switch 352 to the same potential as that of the source of the FET switch 354. Since the gate of the FET switch 352 is also coupled through the resistor 376 to the source of the FET switch 354, the zero drain-to-gate potential causes the FET switch 352 to turn on.

The emitter of the transistor 366 is at a positive potential during this state of operation, therefore base current flows and causes the transistor 366 to saturate, allowing current to flow through the resistor 378 and into the base of the transistor 380 which is in parallel with a resistor 382. The resulting saturation of the transistor 380 connects the gate teminals of the FET switches 358 and 356 to the relatively negative potential line through the conduction of a diode 384, thereby causing FET switches 358 and 356 to be cut off.

At this time, the minimum gate-to-source voltage on the FET switch 358 can be approximately minus 10 volts and the maximum differential voltage from the gate to the source of the FET switch 358 could be approximately 30 volts. This is because the collectors of transistors 328 and 320 may be varying from plus to minus 10 volts.

The input to the second amplifier section 128 is connected to receive the output of the first section 126, at the terminal 388. The signal input is applied through the input resistor 344' and the feedback resistor 346' which are connected at the summing node junction 342'. The impedance values of these resistors are not identical to that of their counterparts in the first amplifier section 126, but the function is the same. The differences in impedances are dictated solely by the magnitude of gain to be achieved in the section.

The various feedback resistors also have values which are based upon the desired gain, and take into consideration the impedance values of the various semi-conductor elements which may be included in the feedback path. Functionally, however, the circuits of the second variable gain amplifier section 128 are substantially similar to those of the first amplifier section 126.

It will be noted that the second amplifier 128 contains two additional feedback resistor stages, to provide a choice of five different gain settings, whereas the first amplifier section 126 only provides a choice of three gain settings. Accordingly, the similar elements of the additional stages have been identified by appropriate reference nmerals which double prime and triple primes have been applied, where appropriate. The output drive capabilities at the collectors of the transistors 328 and 320 are sufficient to provide current to flow through the resistor 386 into the relatively negative power supply. The output from the first amplifier section 126 is therefore taken from junction 388, following the capacitor 362.

Figure 3:
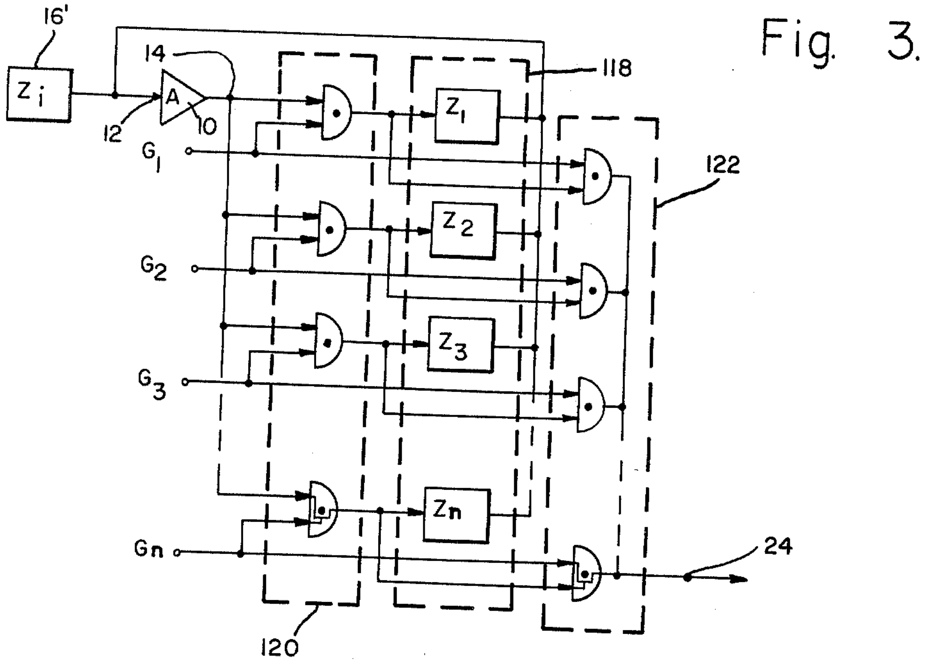
FIG. 3 is a block diagram of an alternative embodiment of the amplifier of FIG. 1 utilizing a plurality of parallel impedance elements.

Turning finally to FIG. 3, there is shown the parallel version of the variable gain amplifier of FIG. 1 in which feedback impedance elements are arranged in parallel. Identical elements have been given identical reference characters. Through appropriate gating circuits similar to those of FIG. 1 or 2, only a single impedance section is included in the feedback loop for gain control. As before, to avoid sneak paths through the non-selected impedances, output gating circuits are provided which are energized by the same selecting signals as the input gating circuits, as described above.

The main difference between the circuits of FIG. 3 and those of FIG. 1 or 2 is that the impedance elements are arranged in parallel rather than in series and, accordingly, the magnitude of each impedance element must be selected to provide appropriate gain selection when it is included in the circuits either singly or in parallel with others of the elements.

Further, in FIG. 3, the amplifier system as shown with a possibility of a plurality "*n*" of gain settings, each selected by an appropriate gain control line $G_1$ throguh $G_N$. Respectively corresponding to each gain control line is an impedance element $Z_1$ through $Z_N$.

For a binary gain system, the feedback impedances should be related to the input impedance 16' by the desired factor of gain. For a gain of 1, the input impedance element 16' should have a magnitude $Z_i$ equal to impedance element $Z_1$. For a gain of 2, $Z_2$ should equal $2Z_i$. Similarly, for a gain of 4, $Z_3$ should equal $4Z_i$ and for a gain of "*n*" $Z_n$ should equal $nZ_i$.

The feedback impedance loop 118 includes the various impedance elements arranged in parallel. A gain control block 120, as shown, includes all of the input gates coupling the amplifier 10 to the impedance loop for selectively enabling one of the gates of the block. A plurality of output gates is included in the output gate block 122, the outputs of which are commonly connected to the output terminal 24. As an alternative embodiment, it will be understood that the input gate to the highest magnitude impedance element may be omitted in that the energizing of a gate selecting any lower value of impedance would shunt substantially all of the amplifier output through the lower value of impedance back to the amplifier input. However, all of the output gates must be included to avoid sneak paths.

Thus, there has been described and shown an improved variable gain amplifier, which most nearly approximately, electronically, a sliding tap potentiometer without any of the mechanical disadvantages of such a device. The overall gain of the system can be instantaneously switched to any one of a plurality of values without "passing through" intermediate values. Further, the circuit output is always taken from the point at which the signal is applied to the feedback loop. Simple circuits can be utilized to select and change gain between an upper limit imposed by the open loop gain of the amplifier element and a lower limit imposed by the short circuit gain of the amplifier.

What is claimed as new is:

1. An amplifier system whose gain can be changed by variable steps in response to applied gain control signals, comprising in combination:

(a) amplifier means having an input terminal and an output terminal, and a system output terminal, said amplifier means having a gain of predetermined magnitude in the absence of signal feedback;

(b) feedback circuit means connected between said input terminal and said output terminal, including at least two impedance elements selectably includable in the circuit between said input terminal and said output terminal; and (c) gain selection means including output gating means connecting said feedback circuit means to said system output terminal for selecting one of said impedance elements for inclusion in the feedback circuit in response to an applied gain control signal and for selectively applying to said system output terminal the signal applied to the selected impedance element, said output gating means interposing a predetermined, relatively small impedance between said system output terminal and the selected impedance element, whereby the overall system gain varies as a function of the included impedance as determined by applied gain control signals.

2. An amplifier system whose gain can be changed by variable steps in response to applied gain control signals, comprising in combination:

(a) amplifier means having an input terminal and an output terminal, said amplifier means having a gain of predetermined magnitude in the absence of signal feedback;

(b) feedback circuit means connected between said input terminal and said output terminal comprising a plurality of serially connected impedance elements each having an input, selectably includable in the circuit between said input terminal and said output terminal;

(c) a system output terminal;

(d) gain selection means including gating means connected to said feedback circuit means for selecting one of said impedance elements for inclusion in the feedback circuit in response to an applied gain control signal, said gain selection means further including a corresponding plurality of output gating elements each coupling a different impedance element input to said system output terminal for selectively applying to said system output terminal the signal applied to the selected impedance element input in response to an applied gain control signal whereby the overall system gain varies as a function of the included impedance as determined by applied gain control signals.

3. The amplifier system of claim 2, above, wherein said gating means and said output gating elements comprise field effect transistors each having a gate terminal connected to receive applied gain control signals.

4. An amplifier system whose gain can be changed by variable steps in response to applied gain control signals, comprising in combination:

(a) a system output terminal;

(b) amplifier means having an input terminal and an output terminal, said amplifier means having a gain of predetermined magnitude in the absence of signal feedback;

(c) feedback circuit means connected between said input terminal and said output terminal, including at least two impedance elements selectably includable in the circuit between said input terminal and said output terminal, said feedback circuit means comprising a plurality of resistive impedance elements having inputs arranged in parallel between said input terminal and said output terminal; and (d) gain selection means including gating means connected to said feedback circuit means for selecting one of said impedance elements for inclusion in the feedback circuit and for applying the signal output of said output terminal to a one of said plurality of impedance elements selected in response to an applied gain control signal said gain selection means further including a corresponding plurality of output gating elements each coupling a different impedance element input to said system output terminal for selectively applying to said system output terminal the signal applied to the selected impedance element input in response to an applied gain control signal whereby the overall system gain varies as a function of the included impedance as determined by applied gain control signals.

5. The amplifier system of claim 4, above, wherein said gating means and said output gating elements comprise field effect transistors each having a gate terminal connected to receive applied gain control signals.

References Cited

UNITED STATES PATENTS

| | | | |
|---|---|---|---|
| 3,153,202 | 10/1964 | Woolam | 330—86 X |
| 3,315,223 | 4/1967 | Hibbard et al. | 340—15.5 |
| 3,355,670 | 11/1967 | Pastoriza | 330—9 |

ROY LAKE, Primary Examiner

JAMES B. MULLINS, Assistant Examiner

U.S. Cl. X.R.

330—28, 29, 110